United States Patent
Tsubuku et al.

(10) Patent No.: US 12,010,871 B2
(45) Date of Patent: Jun. 11, 2024

(54) THIN FILM TRANSISTOR AND DISPLAY DEVICE

(71) Applicant: Japan Display Inc., Tokyo (JP)

(72) Inventors: Masashi Tsubuku, Minato-ku (JP); Tatsuya Toda, Minato-ku (JP)

(73) Assignee: Japan Display Inc., Tokyo (JP)

( * ) Notice: Subject to any disclaimer, the term of this patent is extended or adjusted under 35 U.S.C. 154(b) by 580 days.

(21) Appl. No.: 17/199,991

(22) Filed: Mar. 12, 2021

(65) Prior Publication Data

US 2021/0202639 A1  Jul. 1, 2021

Related U.S. Application Data

(63) Continuation of application No. PCT/JP2019/030207, filed on Aug. 1, 2019.

(30) Foreign Application Priority Data

Sep. 25, 2018 (JP) ................................. 2018-179131

(51) Int. Cl.
*H10K 59/121* (2023.01)
*H01L 27/12* (2006.01)
*H01L 29/423* (2006.01)
*H01L 29/49* (2006.01)
*H01L 29/786* (2006.01)

(52) U.S. Cl.
CPC ... *H10K 59/1213* (2023.02); *H01L 29/42384* (2013.01); *H01L 29/4908* (2013.01); *H01L 29/78648* (2013.01); *H01L 29/7869* (2013.01); *H01L 27/1225* (2013.01); *H01L 2029/42388* (2013.01)

(58) Field of Classification Search
CPC .. H10K 59/1213; H10K 50/814; H10K 50/00; H01L 29/42384; H01L 29/4908; H01L 29/78648; H01L 29/7869; H01L 27/1225; H01L 2029/42388; G09F 9/30
See application file for complete search history.

(56) References Cited

U.S. PATENT DOCUMENTS

| | | |
|---|---|---|
| 2011/0031497 A1 | 2/2011 | Yamazaki et al. |
| 2011/0090207 A1 | 4/2011 | Yamazaki et al. |
| 2013/0299819 A1 | 11/2013 | Yamazaki et al. |

(Continued)

FOREIGN PATENT DOCUMENTS

| | | |
|---|---|---|
| JP | 2011-54946 A | 3/2011 |
| JP | 2011-141524 A | 7/2011 |

(Continued)

OTHER PUBLICATIONS

Office Action dated Sep. 6, 2022, in corresponding Japanese Application No. 2018179131, 10 pages.

(Continued)

*Primary Examiner* — Douglas W Owens
(74) *Attorney, Agent, or Firm* — Maier & Maier, PLLC

(57) ABSTRACT

A thin film transistor including: an active layer formed of an oxide semiconductor including at least indium and gallium; a gate electrode; a first gate insulating layer disposed between the active layer and the gate electrode on the gate electrode side; and a second gate insulating layer, which is a hydrogen block layer, disposed between the active layer and the gate electrode on the active layer side.

18 Claims, 4 Drawing Sheets

(56) References Cited

U.S. PATENT DOCUMENTS

| | | |
|---|---|---|
| 2015/0070254 A1 | 3/2015 | Yamazaki et al. |
| 2016/0027926 A1 | 1/2016 | Yamazaki et al. |
| 2016/0035275 A1 | 2/2016 | Yamazaki et al. |
| 2016/0155759 A1 | 6/2016 | Yamazaki et al. |
| 2017/0288063 A1 | 10/2017 | Yamazaki et al. |
| 2019/0012960 A1 | 1/2019 | Yamazaki et al. |
| 2019/0312062 A1* | 10/2019 | Ishikawa ............ H01L 21/0217 |
| 2020/0258449 A1 | 8/2020 | Yamazaki et al. |

FOREIGN PATENT DOCUMENTS

| | | |
|---|---|---|
| JP | 2013-254950 A | 12/2013 |
| JP | 2016178279 A | 10/2016 |

OTHER PUBLICATIONS

International Search Report dated Oct. 21, 2019 in PCT/JP2019/030207 filed Aug. 1, 2019, citing documents AD-AE and AP-AQ therein, 2 pages.

* cited by examiner

THIN FILM TRANSISTOR AND DISPLAY DEVICE

CROSS-REFERENCE TO RELATED APPLICATION

The present application is Bypass Continuation of International Application No. PCT/JP2019/030207, filed on Aug. 1, 2019, which claims priority from Japanese Application No. JP2018-179131 filed on Sep. 25, 2018. The contents of these applications are hereby incorporated by reference into this application.

BACK GROUND OF THE INVENTION

1. Field of the Invention

The present invention relates to a thin film transistor and a display device.

2. Description of the Related Art

JP2013-254950A discloses a semiconductor device having a gate insulating layer that includes a silicon film containing nitrogen in a gate electrode layer, an oxide insulating layer on the gate insulating layer, and an oxide semiconductor layer in contact with the oxide insulating layer. In JP2013-254950A, the gate insulating layer is a silicon nitride film and the oxide insulating layer is an oxide film containing one or more metal elements selected from the constituent elements of the oxide semiconductor layer, where the gate insulating layer is thicker than the oxide insulating layer.

SUMMARY OF INVENTION

A transistor including an oxide semiconductor, such as IGO and IGZO containing a group 13 element such as gallium and indium, as an active layer has a very small off-leakage current. As such, when using such a transistor for a driving element of a display device, for example, power consumption can be reduced. Further, such a transistor has high charge retention performance when used as a switching element connected to the capacitance, and thus various applications are expected.

However, an oxide semiconductor has high sensitivity to hydrogen, and an active layer becomes n-type by being exposed to hydrogen, and thus an off-leakage current cannot be sufficiently lowered. When silicon nitride is used as a gate insulating layer, hydrogen derived from ammonia gas used in the film forming process remains in the silicon nitride and is diffused, which adversely affects the oxide semiconductor. When forming a silicon nitride film on a large substrate such as a mother glass used for manufacturing a flat panel display, the hydrogen content in the silicon nitride is difficult to be controlled in the plane and its distribution becomes uneven. As such, it is difficult to obtain a transistor having uniform characteristics.

Alternatively, when using silicon oxide as a gate insulating layer, the incorporation of hydrogen during the film forming process can be avoided if the gate insulating layer is formed to have a sufficient thickness. On the other hand, the relative dielectric constant of the silicon oxide is about 4, and is small compared with the relative dielectric constant of silicon nitride, which is about 8. As such, in order to obtain a sufficient drain current, the gate insulating layer must be formed to have a reduced thickness, which possibly results in poor coverage of steps or decrease in dielectric breakdown resistance.

The present invention has been conceived in view of the above, and an object thereof is to sufficiently reduce an off-leakage current of a transistor including an oxide semiconductor as an active layer, to provide a transistor having uniform characteristics when forming a large number of transistors on a large substrate, and to reduce a load on a manufacturing process.

The invention disclosed in the present application in order to solve the above problem has various aspects, and a summary of representative of those aspects is as follows.

A thin film transistor comprising: an active layer formed of an oxide semiconductor including at least indium and gallium; a gate electrode; a first gate insulating layer disposed between the active layer and the gate electrode on the gate electrode side; and a second gate insulating layer, which is a hydrogen block layer, disposed between the active layer and the gate electrode on the active layer side.

The thin film transistor, wherein the first gate insulating layer is a silicon nitride layer, the second gate insulating layer is a silicon oxide layer, and the second gate insulating layer is thicker than the first gate insulating layer.

The thin film transistor, wherein a thickness of the first gate insulating layer is equal to or more than 30 nm and equal to or less than 400 nm, a thickness of the second gate insulating layer is equal to or more than 50 nm and equal to or less than 500 nm, and a total thickness of the first gate insulating layer and the second gate insulating layer is equal to or more than 400 nm.

The thin film transistor, wherein a difference in thickness between the first gate insulating layer and the second gate insulating layer is equal to or more than 50 nm.

The thin film transistor, wherein a total thickness of the first gate insulating layer and the second gate insulating layer is equal to or less than 600 nm.

The thin film transistor, further comprising: a second gate electrode provided on an opposite side of the active layer from the gate electrode; a third gate insulating layer disposed between the active layer and the gate electrode on the gate electrode side; and a fourth gate insulating layer, which is a hydrogen block layer, disposed between the active layer and the gate electrode on the active layer side, wherein a total thickness of the first gate insulating layer and the second gate insulating layer is greater than a total thickness of the third gate insulating layer and the fourth gate insulating layer.

The thin film transistor, wherein the first gate insulating layer and the third gate insulating layer are silicon nitride layers, the second gate insulating layer and the fourth gate insulating layer are silicon oxide layers, the second gate insulating layer is thicker than the first gate insulating layer, and the fourth gate insulating layer is thicker than the third gate insulating layer.

The thin film transistor, wherein the first gate insulating layer and the third gate insulating layer each have a thickness of equal to or more than 30 nm and equal to or less than 400 nm, the second gate insulating layer and the fourth gate insulating layer each have a thickness of equal to or more than 50 nm and equal to or less than 500 nm, and a total thickness of the first gate insulating layer and the second gate insulating layer and a total thickness of the third gate insulating layer and the fourth gate insulating layer are each equal to or more than 400 nm.

The thin film transistor, wherein a difference in thickness between the first gate insulating layer and the second gate insulating layer is equal to or more than 50 nm, and a difference in thickness between the third gate insulating layer and the fourth gate insulating layer is equal to or more than 50 nm.

The thin film transistor, wherein a total thickness of the first gate insulating layer and the second gate insulating layer is equal to or less than 600 nm, and a total thickness of the third gate insulating layer and the fourth gate insulating layer is equal to or less than 600 nm.

A display device having a pixel, the pixel comprising: a thin film transistor; and a pixel electrode connected to the thin film transistor, wherein the thin film transistor includes: an active layer formed of an oxide semiconductor including at least indium and gallium; at least one gate electrode; a first gate insulating layer disposed between the active layer and the gate electrode on the gate electrode side; and a second gate insulating layer, which is a hydrogen block layer, disposed between the active layer and the gate electrode on the active layer side.

The display device, wherein the first gate insulating layer is a silicon nitride layer, the second gate insulating layer is a silicon oxide layer, and the second gate insulating layer is thicker than the first gate insulating layer.

The display device, wherein a thickness of the first gate insulating layer is equal to or more than 30 nm and equal to or less than 400 nm, a thickness of the second gate insulating layer is equal to or more than 50 nm and equal to or less than 500 nm, and a total thickness of the first gate insulating layer and the second gate insulating layer is equal to or more than 400 nm.

The display device, wherein a difference in thickness between the first gate insulating layer and the second gate insulating layer is equal to or more than 50 nm.

The display device, wherein a total thickness of the first gate insulating layer and the second gate insulating layer is equal to or less than 600 nm.

The display device, further comprising: a second gate electrode provided on an opposite side of the active layer from the gate electrode; a third gate insulating layer provided between the active layer and the gate electrode on the gate electrode side; and a fourth gate insulating layer, which is a hydrogen block layer, disposed between the active layer and the gate electrode on the active layer side, wherein a total thickness of the first gate insulating layer and the second gate insulating layer is greater than a total thickness of the third gate insulating layer and the fourth gate insulating layer.

The display device, wherein the first gate insulating layer and the third gate insulating layer are silicon nitride layers, the second gate insulating layer and the fourth gate insulating layer are silicon oxide layers, the second gate insulating layer is thicker than the first gate insulating layer, and the fourth gate insulating layer is thicker than the third gate insulating layer.

The display device, wherein the first gate insulating layer and the third gate insulating layer each have a thickness of equal to or more than 30 nm and equal to or less than 400 nm, the second gate insulating layer and the fourth gate insulating layer each have a thickness of equal to or more than 50 nm and equal to or less than 500 nm, and a total thickness of the first gate insulating layer and the second gate insulating layer and a total thickness of the third gate insulating layer and the fourth gate insulating layer are each equal to or more than 400 nm.

The display device, wherein a difference in thickness between the first gate insulating layer and the second gate insulating layer is equal to or more than 50 nm, and a difference in thickness between the third gate insulating layer and the fourth gate insulating layer is equal to or more than 50 nm.

The display device, wherein a total thickness of the first gate insulating layer and the second gate insulating layer is equal to or less than 600 nm, and a total thickness of the third gate insulating layer and the fourth gate insulating layer is equal to or less than 600 nm.

DETAILED DESCRIPTION OF THE INVENTION

Figure 1:
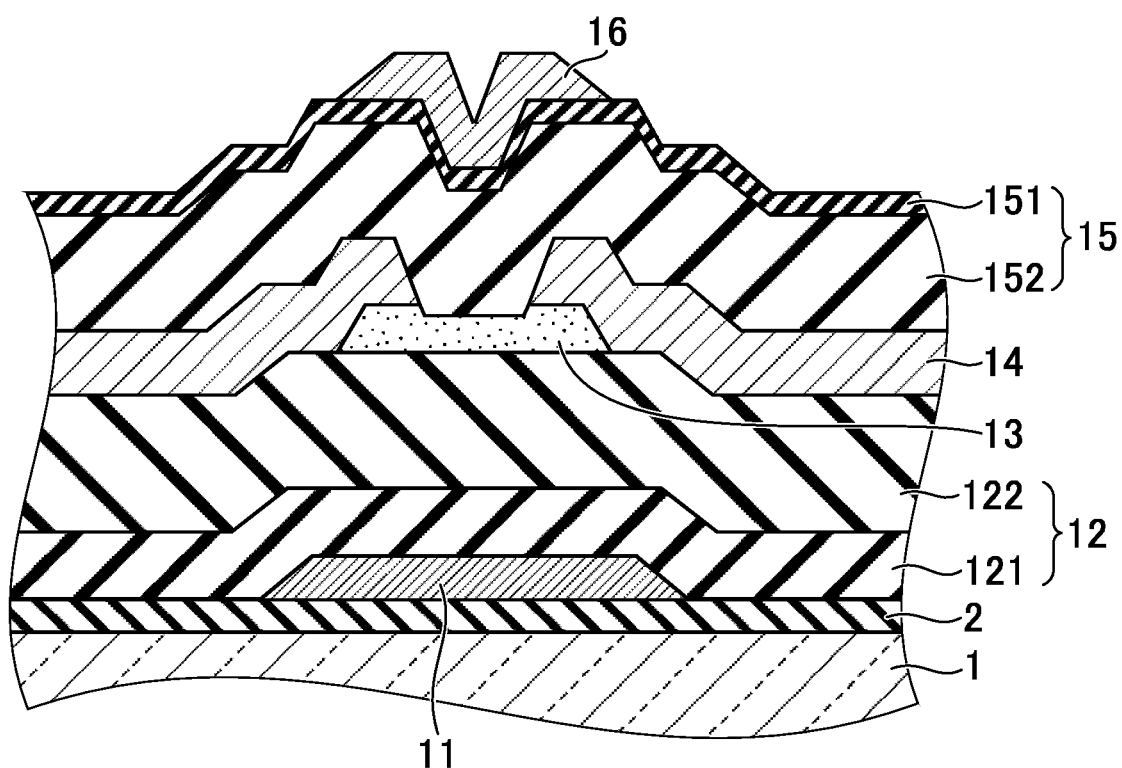
FIG. 1 is a diagram for illustrating a cross section of a transistor according to an embodiment of the present invention.

Embodiments of the present invention will be described below in detail with reference to the accompanying drawings. The disclosure is merely an example, and appropriate modifications while keeping the gist of the invention that can be easily conceived by those skilled in the art are naturally included in the scope of the invention. The accompanying drawings may schematically illustrate widths, thicknesses, shapes, or other characteristics of each part for clarity of illustration, compared to actual configurations. However, such a schematic illustration is merely an example and not intended to limit the present invention. In this specification and each drawing, the same elements as those already described with reference to the already-presented drawings are denoted by the same reference numerals, and detailed description thereof may be appropriately omitted.

FIG. 1 is a diagram for illustrating a cross section of a transistor 10 according to an embodiment of the present invention.

The transistor 10 is a thin film transistor formed on an undercoat layer 2 on a substrate 1 using a photolithographic technique. In the present embodiment, the transistor 10 has a so-called dual gate structure in which gate electrodes are provided on the upper side and the lower side of an oxide semiconductor layer 13, which is an active layer. Alternatively, the transistor 10 may have so-called staggered or inverted staggered structure in which a gate electrode is provided on either the upper side or the lower side of the oxide semiconductor layer 13.

The substrate 1 is an inorganic or an organic substrate, such as a glass substrate, a quartz substrate, and a resin substrate, and may be rigid or flexible. The undercoat layer 2 is a film that functions as a barrier layer against impurities. A lower gate electrode layer 11 is formed on the undercoat layer 2. The lower gate electrode layer 11 may be formed of a metal or alloy layer, or a conductive metal oxide or other conductive materials, and preferably low-resistance material is selected.

A lower gate insulating layer 12 is formed on the lower gate electrode layer 11. The lower gate insulating layer 12 includes a lower first gate insulating layer 121 in contact with the gate electrode layer 11 and a lower second gate insulating layer 122 in contact with the oxide semiconductor layer 13 formed on the lower gate insulating layer 12. The lower first gate insulating layer 121 and the lower second gate insulating layer 122 are made of different materials. Here, the lower first gate insulating layer 121 contains hydrogen therein for compositional or manufacturing process reasons. On the other hand, the lower second gate insulating layer 122 virtually does not contain hydrogen therein, and functions as a hydrogen block layer that prevents diffusion of hydrogen from the lower first gate insulating layer 121 into the oxide semiconductor layer 13.

In the present embodiment, the lower first gate insulating layer 121 is a silicon nitride layer, and the lower second gate insulating layer 122 is a silicon oxide layer. The relative dielectric constant of the lower first gate insulating layer 121 is about 8 and that of the lower second gate insulating layer 122 is about 4. That is, the lower first gate insulating layer 121 has a larger relative dielectric constant. The lower first gate insulating layer 121 is formed to have a thickness equal to or more than 30 nm and equal to or less than 400 nm, preferably equal to or more than 50 nm and equal to or less than 300 nm, more preferably equal to or more than 100 nm and equal to or less than 200 nm. The lower second gate insulating layer 122 is formed to have a thickness equal to or more than 50 nm and equal to or less than 500 nm, preferably equal to or more than 100 nm and equal to or less than 400 nm, more preferably equal to or more than 200 nm and equal to or less than 300 nm. Further, the total thickness of the lower first gate insulating layer 121 and the lower second gate insulating layer 122 is 400 nm or more. The upper limit of the total thickness of the lower first gate insulating layer 121 and the lower second gate insulating layer 122 is not necessarily provided, but is preferably 600 nm or less from the viewpoint of film forming time.

The lower second gate insulating layer 122 may be preferably thicker than the lower first gate insulating layer 121. The difference between the thickness of the lower second gate insulating layer 122 and the thickness of the lower first gate insulating layer 121 is preferably 50 nm or more, more preferably 100 nm or more.

The reason for laminating the lower first gate insulating layer 121 and the lower second gate insulating layer 122 is that the lower first gate insulating layer 121 contains hydrogen in the structure due to the manufacturing process and thus prevents diffusion of hydrogen into the oxide semiconductor layer 13 without direct contact with the oxide semiconductor layer 13. As such, although the lower second gate insulating layer 122 needs to prevent the diffusion of hydrogen from the lower first gate insulating layer 121 into the oxide semiconductor layer 13, the silicon oxide used in the lower second gate insulating layer 122 in the present embodiment does not have a property of preventing the hydrogen from penetrating into the structure due to diffusion. Accordingly, the lower second gate insulating layer 122 is required to have a thickness that does not substantially allow the hydrogen to penetrate into the lower second gate insulating layer 122 even if the hydrogen is diffused from the lower first gate insulating layer 121 due to heating in the manufacturing process of the transistor 10. As such, the lower second gate insulating layer 122 is required to be thicker than the lower first gate insulating layer 121.

On the other hand, the silicon oxide has a low dielectric constant as described above, and thus, when the gate insulating layer 12 is generated only with silicon oxide, drain current is insufficient or process cost is increased due to a thicker film. As such, the lower first gate insulating layer 121 made of silicon nitride having a high dielectric constant is provided at a position in contact with the lower gate electrode layer 11 as far as possible from the oxide semiconductor layer 13 so as to increase the dielectric constant of the entire gate insulating layer 12. The total thickness of the lower first gate insulating layer 121 and the lower second gate insulating layer 122 is 400 nm or more so as to sufficiently ensure the dielectric constant of the entire gate insulating layer 12 and to prevent diffusion of hydrogen into the oxide semiconductor layer 13.

The material of the lower second gate insulating layer 122 may be a material other than silicon oxide. If the material has high hydrogen blocking capability and high dielectric constant, the thickness of the lower second gate insulating layer 122 may be determined without being limited to the numerical range described above. Examples of such materials include aluminum oxide and hafnium oxide.

Further, the oxide semiconductor layer 13 is formed on an area of the lower gate insulating layer 12 overlapping with the lower gate electrode layer 11. The oxide semiconductor layer 13 is an active layer of the transistor 10, and a metal oxide containing at least indium and gallium in the group 13 elements. In the present embodiment, the oxide semiconductor layer 13 is a transparent semiconductor made of oxides of indium, gallium, and zinc known as IGZO.

An electrode layer 14 is formed on the oxide semiconductor layer 13 and the gate insulating layer 12 such that a part of the electrode layer 14 is in contact with the oxide semiconductor layer 13. The electrode layer 14 has a shape of a source electrode and a drain electrode by patterning, and the source electrode and the drain electrode disposed at a predetermined distance without being in contact with each other on the oxide semiconductor layer 13. As such, on the oxide semiconductor layer 13, there is a portion that is not covered by the electrode layer 14. Similarly to the lower gate electrode 11, the electrode layer 14 may be formed of a metal or alloy layer, or a conductive metal oxide or other conductive materials, and preferably a low-resistance material is selected. Further, the electrode layer 14 may be a single layer or a multilayer.

An upper gate insulating layer 15 is further formed on the oxide semiconductor layer 13 and the electrode layer 14. The upper gate insulating layer 15 includes an upper first gate insulating layer 151 in contact with the upper gate electrode layer 16 and an upper second gate insulating layer 152 in contact with the oxide semiconductor layer 13, and the upper first gate insulating layer 151 and the upper second gate insulating layer 152 are made of different materials. The property of the upper first gate insulating layer 151 is the same as that of the lower first gate insulating layer 121 described above, and the property of the upper second gate insulating layer 152 is the same as that of the lower second gate insulating layer 122 described above.

That is, the upper first gate insulating layer 151 contains hydrogen in the structure by the manufacturing process, and is silicon nitride in the present embodiment. The upper first gate insulating layer 151 is formed to have a thickness equal to or more than 30 nm and equal to or less than 400 nm, preferably equal to or more than 50 nm and equal to or less than 300 nm, more preferably equal to or more than 100 nm and equal to or less than 200 nm. Further, the upper second gate insulating layer 152 virtually does not contain hydrogen therein, and functions as a hydrogen block layer. The upper second gate insulating layer 152 is formed to have a thickness equal to or more than 50 nm and equal to or less than 500 nm, preferably equal to or more than 100 nm and equal to or less than 400 nm, more preferably equal to or more than 200 nm and equal to or less than 300 nm.

Similarly, the total thickness of the upper first gate insulating layer 151 and the upper second gate insulating layer 152 is preferably 400 nm or more and 600 nm or less for manufacturing purposes, the upper second gate insulating layer 152 is thicker than the upper first gate insulating layer 151, and the difference therebetween is preferably 50 nm or more, and more preferably 100 nm or more.

As described above, the first gate insulating layer in contact with the gate electrode layer and the second gate insulating layer in contact with the oxide semiconductor layer 13 are laminated on both of the lower gate electrode layer 11 and the upper gate electrode layer 16 as gate insulating layers. The second gate insulating layer functions as a hydrogen block layer. The thickness of the first gate insulating layer is 30 nm or more and 400 nm or less, preferably 50 nm or more and 300 nm or less, more preferably 100 nm or more and 200 nm or less. The thickness of the second gate insulating layer is 50 nm or more and 500 nm or less, preferably 100 nm or more and 400 nm or less, more preferably 200 nm or more and 300 nm or less. The total thickness of the first gate insulating layer and the second gate insulating layer is 400 nm or more and 600 nm or less, and the second gate insulating layer is thicker than the first gate insulating layer. The difference between the first gate insulating layer and the second gate insulating layer may be preferably 50 nm or more, more preferably 100 nm or more.

Finally, an upper gate electrode layer 16 is formed on the upper gate insulating layer 15 and at a position overlapping with the oxide semiconductor layer 13. Similarly to the lower gate electrode layer 11, the upper gate electrode layer 16 may be formed of a metal or alloy layer, or a conductive metal oxide or other conductive materials, and preferably a low-resistance material is selected.

The transistor 10 is thus formed on the substrate 1. Subsequently, depending on the usage of the transistor 10, a through hole penetrating the upper gate insulating layer 15 is formed as needed so as to connect the transistor 10 with an appropriate electrical circuit formed on the upper gate insulating layer, whereby any device having the transistor 10 is formed. Examples of such a device include displays such as an LCD and an OLED. In this regard, the electric circuit described above may be formed on any insulating layer, such as a flattening layer, formed on the transistor 10.

Next, referring to FIGS. 2 and 3, a transistor according to an embodiment of the present invention and a manufacturing process of a display device using the transistor will be described.

Figure 2:
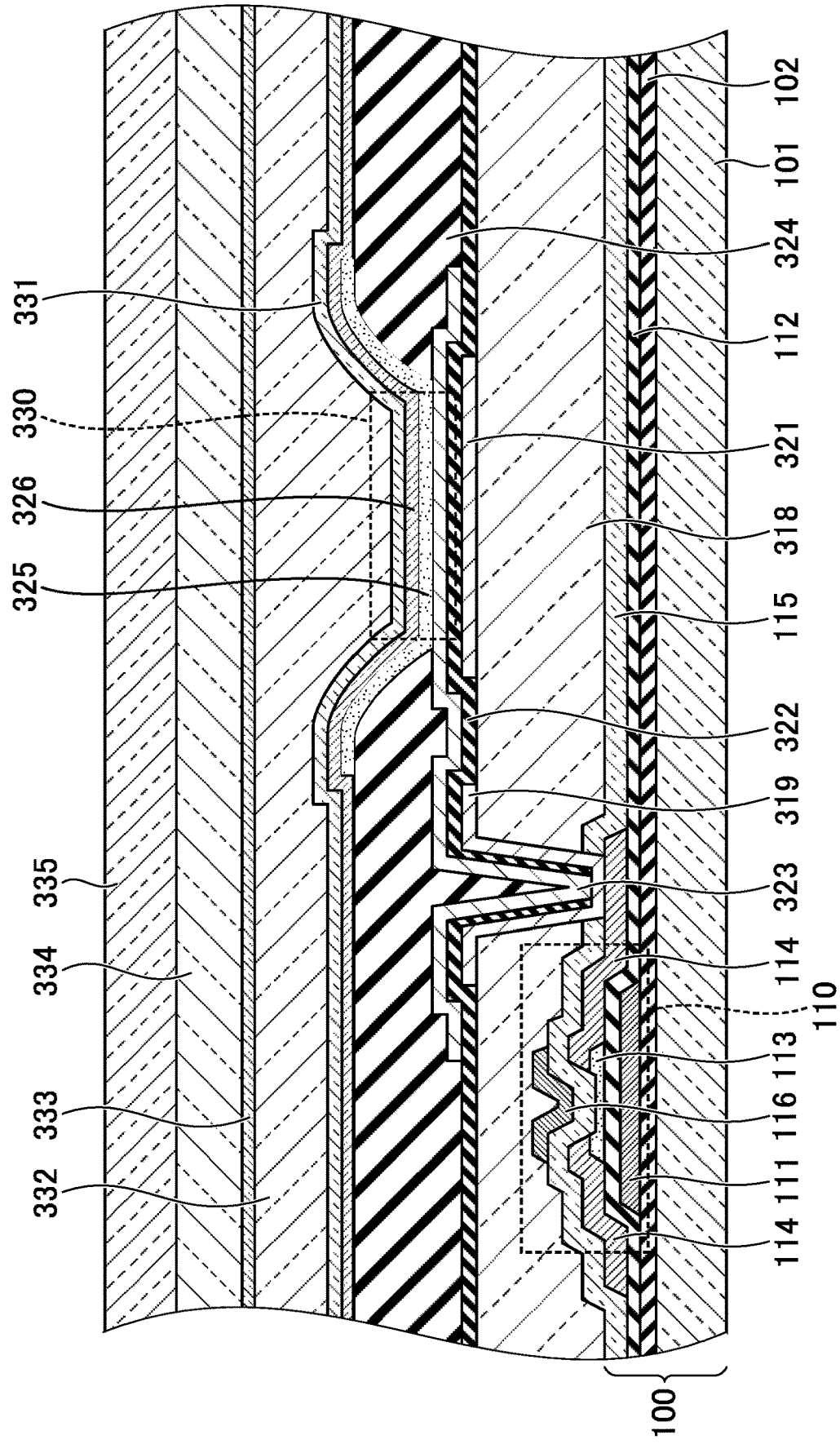
FIG. 2 is a diagram illustrating a transistor according to an embodiment of the present invention and a display device, which is an OLED, using the transistor and a manufacturing process of the display device.
Figure 3:
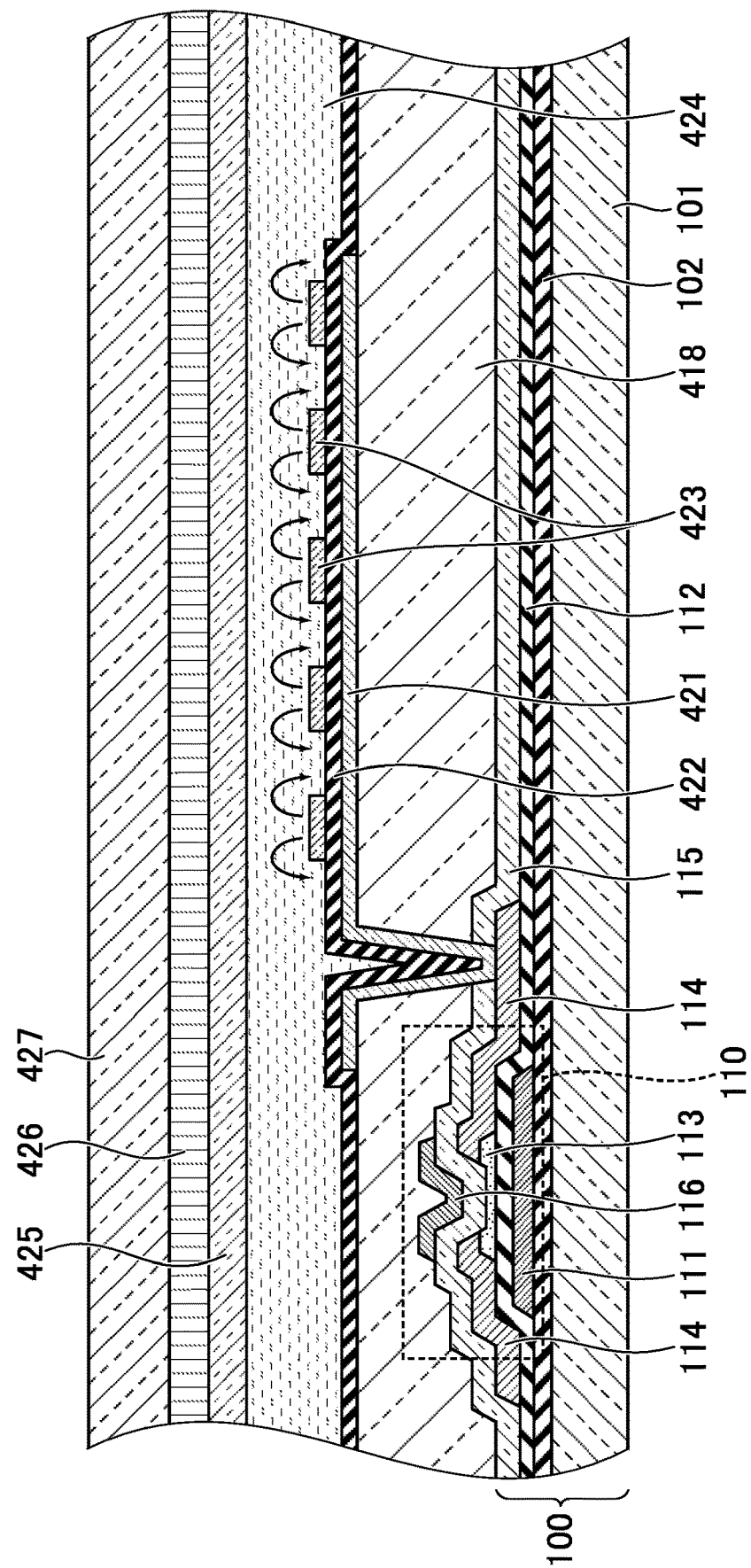
FIG. 3 is a diagram illustrating a transistor according to an embodiment of the present invention and a display device, which is an LCD, using the transistor and a manufacturing process of the display device.

Manufacture of Transistor 110 (FIGS. 2 and 3)

A substrate 101 is prepared. Examples of the substrate 101 include a glass substrate, a quartz substrate, and a resin substrate. A resin substrate provides flexibility to the substrate 101.

An undercoat layer 102 is formed on the substrate 101. One of the purposes of providing the undercoat layer 102 is to serve as a barrier film for preventing an impurity contained in the substrate 101 or an impurity entered from the back surface of the substrate 101. In this case, the undercoat layer 102 may be formed of silicon nitride, silicon nitride oxide, aluminum nitride, aluminum nitride oxide, aluminum oxide, which have excellent barrier properties, or a laminated film containing these materials.

A lower gate electrode layer 111 is formed on the undercoat. The lower gate electrode layer 111 may use a metal, such as aluminum, titanium, chromium, molybdenum, tantalum, and tungsten, or an alloy containing these metals. The lower gate electrode layer 111 of the transistor 110 may use a transparent conductive material, such as ITO and IZO, in addition to the metal materials described above. In a case where such a layer is used not only as the lower gate electrode layer 111 of the transistor 110 but also as a conductive layer for forming surrounding wiring, it is more preferable to use the metal materials described above, since low resistance is required. The lower gate electrode layer 111 may be formed to have a thickness of about 50 nm to 700 nm, preferably 100 nm to 500 nm.

A lower gate insulating layer 112 is formed on the lower gate electrode layer 111. The lower gate insulating layer 112 is a multilayer film including a lower first gate insulating layer in contact with the lower gate electrode layer 111 and a lower second gate insulating layer in contact with the oxide semiconductor layer 113. In the present embodiment, the lower first gate insulating layer is formed of silicon nitride, and the lower second gate insulating layer is formed of silicon oxide. The thickness and properties of the lower gate insulating layer 112 are as described above.

The oxide semiconductor layer 113 is formed on the lower gate insulating layer 112 in an area overlapping with the lower gate electrode layer 111 formed in advance. The oxide semiconductor layer 113 is typically a metal oxide containing a group 13 element such as indium and gallium, and specifically, IGO and IGZO. The oxide semiconductor layer 113 may contain other elements, for example, tin belonging to group 14 elements, and titanium and zirconium belonging to group 4 elements. The oxide semiconductor layer 113 may be formed to have a thickness of about 5 nm to 100 nm, preferably 5 nm to 60 nm.

The crystallinity of the oxide semiconductor layer 113 is not particularly limited, and may be any of a single crystal, a polycrystal, and a microcrystal. Alternatively, the oxide semiconductor layer 113 may be amorphous. The characteristics of the oxide semiconductor layer 113 may preferably include few crystal defects, such as oxygen deficiency, and a low hydrogen content concentration. This is because hydrogen contained in the oxide semiconductor layer 113 functions as a donor and induces a current leakage of the transistor.

An electrode layer 114 is formed in contact with the oxide semiconductor layer 113. As shown, the electrode layer 114 is formed as a source electrode and a drain electrode. Similarly to the gate electrode layer 111, the electrode layer 114 may use a metal, such as aluminum, titanium, chromium, molybdenum, tantalum, and tungsten, or an alloy containing these metals. The electrode layer 114 is formed in contact with the oxide semiconductor layer 113, and thus, the surface of the electrode layer 114 in contact with the oxide semiconductor layer 113 may preferably be formed of a material having ohmic resistive properties at the connection part thereof. The electrode layer 114 may be formed to have a thickness of about 50 nm to 1 μm, preferably 300 nm to 700 nm.

The electrode layer 114 is patterned by etching to form a source electrode and a drain electrode. At this time, a surrounding wiring circuit may be formed simultaneously.

In this way, a single-gate inverted-staggered transistor is formed. If the transistor is a dual-gate transistor 110, the following steps may be added.

That is, an upper gate insulating layer 115 is formed on the oxide semiconductor layer 113 and the electrode layer 114.

The upper gate insulating layer 115 is a multilayer film including an upper first gate insulating layer in contact with an upper gate electrode layer 116 and an upper second gate insulating layer in contact with the oxide semiconductor layer 113. In the present embodiment, the upper first gate insulating layer is formed of silicon nitride, and the upper second gate insulating layer is formed of silicon oxide. The thickness and properties of the upper gate insulating layer 115 are as described above.

The upper gate electrode layer 116 is formed on the upper gate insulating layer 115 at a position overlapping with the oxide semiconductor layer 113. Similarly to the lower gate electrode layer 111, the upper gate electrode layer 116 may use a metal such as aluminum, titanium, chromium, molybdenum, tantalum, and tungsten, or an alloy containing these metals, or a transparent conductive material such as ITO and IZO. The upper gate electrode layer 111 may be formed to have a thickness of about 50 nm to 700 nm, preferably 100 nm to 500 nm.

With the above steps, the dual-gate transistor 110 and the surrounding wiring layer (not shown) are formed.

Manufacture of Display Device 200 (FIG. 2)

After the transistor 110 is formed, a flattening layer 318 overlying the transistor 110 is formed. One of the purposes to provide the flattening layer 318 is to reduce the unevenness of the transistor 110, for example. The flattening layer 318 may use a thermosetting or a photocuring organic resin. The flattening layer 318 may be formed to have a thickness about 300 nm to 2 μm, preferably 500 nm to 1 μm.

A contact hole reaching the electrode layer 114 is formed in the flattening layer 318. A pixel electrode 323 is then formed to be electrically connected to the drain electrode of the electrode layer 114 through the contact hole. As shown in FIG. 2, after the contact hole is formed, a conductive layer 319 may be formed so as to cover the contact hole, and a conductive layer 321 may be formed simultaneously. One of the purposes to provide the conductive layer 319 is to improve the connection between the drain electrode of the electrode layer 114 and the pixel electrode 323. The conductive layer 321 is provided so as to overlap with the pixel electrode 323 via a capacitance insulating layer 322 and to form a capacitance at the overlapped portion.

Here, the pixel electrode 323 functions as an anode of the organic EL element 330. In a case where the display device 200 is configured as a top emission type, the pixel electrode 323 is formed as a reflecting electrode. At this time, the pixel electrode 323 is required to have a good surface reflectivity and the work function for functioning as an anode of the organic EL element 330. In order to satisfy these requirements, the pixel electrode 323 may be formed as a laminated film of highly reflective aluminum and silver having the outermost surface made of an indium-based oxide conductive layer, such as ITO and IZO. The pixel electrode may be formed such that a thickness of the reflective layer made of materials such as aluminum and silver is about 50 nm to 300 nm, preferably 100 nm to 200 nm, and the surface layer made of ITO and IZO formed thereon is about 5 nm to 100 nm, preferably 10 nm to 50 nm.

Subsequently, an insulating layer 324 is formed so as to cover the end of the pixel electrode 323 and provide an opening exposing the upper surface of the pixel electrode 323. An area corresponding to the upper surface of the pixel electrode 323 exposed from the insulating layer 324 is to be a light emitting area of the organic EL device later. The insulating layer 324 functions as a member for separating adjacent pixel electrodes 323, and is thus generally referred to as a "partition wall," "bank," and "rib", for example. The insulating layer 324 may be preferably formed to have a flat upper surface and a smooth tapered side wall of the opening portion, and may use a thermosetting or a photocuring organic resin similarly to the flattening layer 318. The insulating layer 324 may be formed to have a thickness of about 300 nm to 2 μm, preferably 500 nm to 1 μm.

An organic layer 325 is formed so as to cover the exposed pixel electrode 323. The organic layer 325 includes at least a light-emitting layer, and functions as a light-emitting part of the organic EL element 330. The organic layer 325 may include charge transport layers, such as a hole injection layer, a hole transport layer, an electron injection layer, and an electron transport layer, in addition to the light-emitting layer, and may further include charge block layers, such as a hole block layer and an electron block layer. The thickness of the organic layer 325 varies depending on the included layers and their optical properties, and may be about 5 nm to 500 nm, preferably 10 nm to 150 nm. In FIG. 2, the organic layer 325 is provided on one pixel electrode 323, although the organic layer 325 may be continuously formed on a plurality of pixel electrodes 323 and the insulating layer 324.

After the organic layer 325 is formed, a counter electrode 326 is formed. Here, the counter electrode 326 functions as a cathode of the organic EL device 330. In a case where the display device 200 is configured as a top emission type, the counter electrode 326 is formed as a transparent electrode. At this time, the counter electrode 326 is required to have high transmittance that does not interfere with light emission from the organic layer 325 and a work function for functioning as a cathode of the organic EL element 330. In order to satisfy these requirements, the counter electrode 326 may be formed as an indium-based oxide transparent conductive layer, such as ITO and IZO, or a thin film made of magnesium, silver, or an alloy or a compound thereof and having thickness to ensure enough transmittance. When using an indium-based oxide transparent conductive layer, the counter electrode 326 may be formed to have a thickness of about 50 nm to 500 nm, preferably 100 nm to 300 nm, and when using magnesium, silver, or an alloy or a compound thereof, a thickness of about 5 nm to 50 nm, preferably 10 nm to 30 nm. The counter electrode 326 is a common electrode for a plurality of organic EL elements 330, and formed continuously on a plurality of pixel electrodes 323 and the insulating layer 324.

The functions of the organic EL element 330 are easily deteriorated due to penetration of moisture, and thus, a sealing layer is formed. In FIG. 2, as an example, a sealing layer including an inorganic insulating layer 331, an organic insulating layer 332, and an inorganic insulating layer 333 is formed. The inorganic insulating layers 331 and 333 may be formed of silicon nitride, silicon nitride oxide, aluminum nitride, aluminum nitride oxide, aluminum oxide, which have excellent barrier properties, or a laminated film containing these materials. The organic insulating layer 332 may use a thermosetting or photocuring organic resin. The sealing layer has a laminate structure of the inorganic insulating layers 331 and 333 and the organic insulating layer 332, and thus it is possible to prevent seal failures due to particles mixed during the processes. The thickness of the sealing layer may be about 300 nm to 2 μm, preferably 500 nm to 1 μm in the inorganic insulating layers 331 and 333, and about 1 μm to 20 μm, preferably 2 μm to 10 μm in the organic insulating layer 332.

With the steps described above, the display device 200, which is an OLED, is manufactured. As shown in FIG. 2, a counter substrate 335 may be provided on the inorganic insulating layer 333 with an adhesive 334 interposed therebetween. The counter substrate 335 may have functions of a cover glass and a touch sensor, for example.

[Manufacture of Display Device 400] (FIG. 3)

After the transistor 110 is formed, a flattening layer 418 covering the transistor 110 is formed. One of the purposes to provide the flattening layer 418 is to reduce the unevenness of the transistor 110, for example. The flattening layer 418 may use a thermosetting or a photocuring organic resin. The flattening layer 418 may be formed to have a thickness of about 300 nm to 2 μm, preferably 500 nm to 1 μm.

A contact hole reaching the electrode layer 114 is formed in the flattening layer 418. A pixel electrode 421 is then formed to be electrically connected to the drain electrode of the electrode layer 114 through the contact hole. The pixel electrode 421 may use an indium-based oxide transparent conductive layer, such as ITO and IZO. The pixel electrode 421 may be formed to have a thickness of about 50 nm to 500 nm, preferably 100 nm to 300 nm.

Common electrodes 423 are formed on the pixel electrode 421 with the insulating layer 422 therebetween. Similarly to the pixel electrode 421, the common electrodes 423 may use an indium-based oxide transparent conductive layer, such as ITO and IZO. In FIG. 3, although the common electrodes 423 are illustrated discretely, they are connected to each other when viewed in a plan view and formed in a comb-like or a plate shape having slits. The shapes of the pixel electrode 421 and the common electrode 423 are not limited to this example, and the pixel electrode in a comb-like or a plate shape having slits may be formed on the common electrodes formed in a plate shape with the insulating layer 422 therebetween.

The color filter 426 and the overcoat layer 425 are formed on the counter substrate 427 so as to face the substrate 101, and a liquid crystal layer 424 is provided in the gap therebetween. In the liquid crystal layer 424, the alignment direction of the liquid crystal is controlled by the pixel electrode 421 and the common electrode 423 described above and the lateral electric field applied as indicated by the arrow, and the transmittance of the light beam is controlled.

With the steps described above, the display device 400, which is an LCD, is manufactured.

Figure 4:
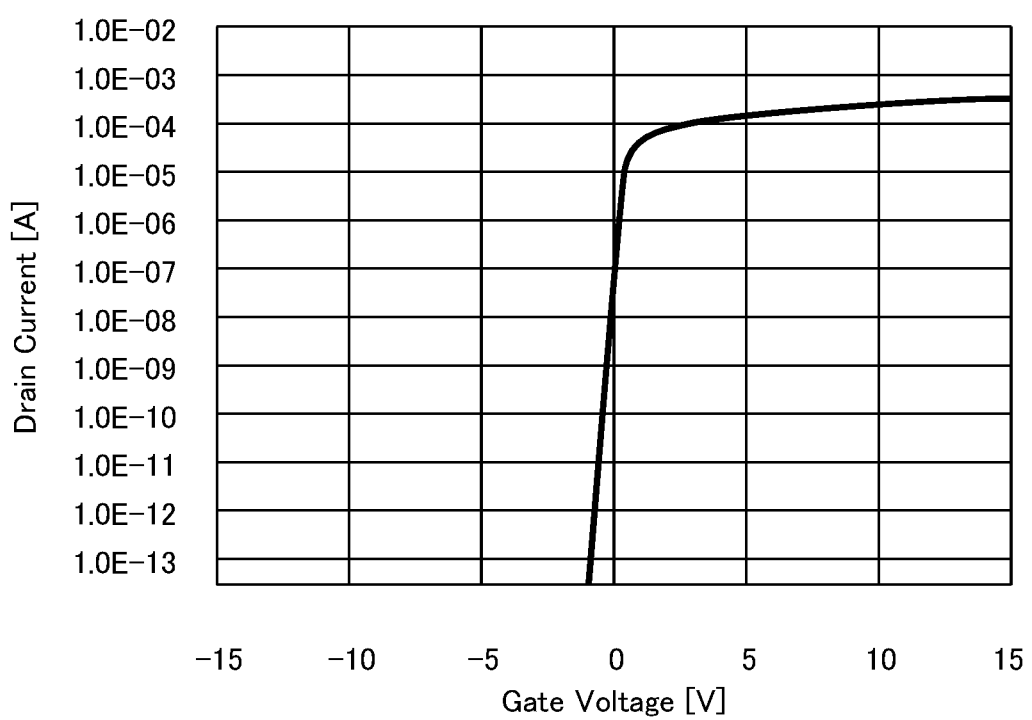
FIG. 4 is a graph showing measurement results of a drain current value with respect to a gate voltage of the generated transistor.

FIG. 4 is a graph showing measurement results of the drain current value with respect to the gate voltage of the transistor generated by the process described above. In FIG. 4, the horizontal axis shows the gate voltage [V], and the vertical axis shows the drain current [A].

The graph shows that, when the gate voltage falls from a positive value to near 0, the transistor is turned off and the drain current rapidly decreases. When the gate voltage falls below approximately -1V, the drain current value falls below the detection limit, which is at least $1.0 \times 10^{-13}$ [A] or lower in this example. Even if the gate voltage is a negative voltage equal to or less than such a value, the drain current is not detected, and the off-leakage current is kept at $1.0 \times 10^{-13}$ [A] or lower.

In this measurement sample, the width of the gate electrode is 3.5 μm and the length is 12 cm (120,000 μm) as a sample for measuring the leak resistance. As such, when considering a gate electrode having the same width of 3.5 μm, the off-leakage current per 1 mm of the electrode length is as small as $1.0 \times 10^{-18}$ [A] or less, and the off-leakage current can be sufficiently reduced.

Further, the diffusion of hydrogen from the layer containing hydrogen, such as silicon nitride, into the oxide semiconductor layer is structurally suppressed, and thus the variations in characteristics of the transistor are small. This serves to obtain uniform characteristics of the transistor and eliminates the need of excessively thickening the gate insulating layer, and thus the load on the manufacturing process is small.

That is, the off-leakage current is small in the display devices 200 and 400 using the transistor according to the present embodiment described above, and this serves to achieve power savings and uniform display performance in the plane.

Within the scope of the idea of the present invention, those skilled in the art can come up with various changes and modifications and it will be understood that these changes and modifications also fall into the scope of the present invention. For example, in each of the above-described embodiments, addition, deletion or redesign of a component, or addition, omission or condition change of a process, which are appropriately made by a person skilled in the art, are also included within the scope of the present invention as long as they remain the gist of the present invention.

What is claimed is:

1. A thin film transistor comprising:
an active layer formed of an oxide semiconductor including at least indium and gallium;
a gate electrode;
a first gate insulating layer disposed between the active layer and the gate electrode on the gate electrode side;
a second gate insulating layer, which is a hydrogen block layer, disposed between the active layer and the gate electrode on the active layer side;
a second gate electrode provided on an opposite side of the active layer from the gate electrode;
a third gate insulating layer disposed between the active layer and the gate electrode on the gate electrode side; and
a fourth gate insulating layer, which is a hydrogen block layer, disposed between the active layer and the gate electrode on the active layer side, wherein
a total thickness of the first gate insulating layer and the second gate insulating layer is greater than a total thickness of the third gate insulating layer and the fourth gate insulating layer.

2. The thin film transistor according to claim 1, wherein
the first gate insulating layer is a silicon nitride layer,
the second gate insulating layer is a silicon oxide layer, and
the second gate insulating layer is thicker than the first gate insulating layer.

3. The thin film transistor according to claim 2, wherein
a thickness of the first gate insulating layer is equal to or more than 30 nm and equal to or less than 400 nm,
a thickness of the second gate insulating layer is equal to or more than 50 nm and equal to or less than 500 nm, and
a total thickness of the first gate insulating layer and the second gate insulating layer is equal to or more than 400 nm.

4. The thin film transistor according to claim 2, wherein
a difference in thickness between the first gate insulating layer and the second gate insulating layer is equal to or more than 50 nm.

5. The thin film transistor according to claim 2, wherein
a total thickness of the first gate insulating layer and the second gate insulating layer is equal to or less than 600 nm.

6. The thin film transistor according to claim 1, wherein
the first gate insulating layer and the third gate insulating layer are silicon nitride layers,
the second gate insulating layer and the fourth gate insulating layer are silicon oxide layers,
the second gate insulating layer is thicker than the first gate insulating layer, and
the fourth gate insulating layer is thicker than the third gate insulating layer.

7. The thin film transistor according to claim 6, wherein
the first gate insulating layer and the third gate insulating layer each have a thickness of equal to or more than 30 nm and equal to or less than 400 nm,
the second gate insulating layer and the fourth gate insulating layer each have a thickness of equal to or more than 50 nm and equal to or less than 500 nm, and
a total thickness of the first gate insulating layer and the second gate insulating layer and a total thickness of the third gate insulating layer and the fourth gate insulating layer are each equal to or more than 400 nm.

8. The thin film transistor according to claim 6, wherein
a difference in thickness between the first gate insulating layer and the second gate insulating layer is equal to or more than 50 nm, and
a difference in thickness between the third gate insulating layer and the fourth gate insulating layer is equal to or more than 50 nm.

9. The thin film transistor according to claim 6, wherein
a total thickness of the first gate insulating layer and the second gate insulating layer is equal to or less than 600 nm, and
a total thickness of the third gate insulating layer and the fourth gate insulating layer is equal to or less than 600 nm.

10. A display device having a pixel, the pixel comprising:
a thin film transistor; and
a pixel electrode connected to the thin film transistor, wherein
the thin film transistor includes:
an active layer formed of an oxide semiconductor including at least indium and gallium;
at least one gate electrode;
a first gate insulating layer disposed between the active layer and the gate electrode on the gate electrode side;
a second gate insulating layer, which is a hydrogen block layer, disposed between the active layer and the gate electrode on the active layer side;
a second gate electrode provided on an opposite side of the active layer from the gate electrode;
a third gate insulating layer provided between the active layer and the gate electrode on the gate electrode side; and
a fourth gate insulating layer, which is a hydrogen block layer, disposed between the active layer and the gate electrode on the active layer side, wherein
a total thickness of the first gate insulating layer and the second gate insulating layer is greater than a total thickness of the third gate insulating layer and the fourth gate insulating layer.

11. The display device according to claim 10, wherein
the first gate insulating layer is a silicon nitride layer,
the second gate insulating layer is a silicon oxide layer, and
the second gate insulating layer is thicker than the first gate insulating layer.

12. The display device according to claim 11, wherein
a thickness of the first gate insulating layer is equal to or more than 30 nm and equal to or less than 400 nm,
a thickness of the second gate insulating layer is equal to or more than 50 nm and equal to or less than 500 nm, and
a total thickness of the first gate insulating layer and the second gate insulating layer is equal to or more than 400 nm.

13. The display device according to claim 11, wherein
a difference in thickness between the first gate insulating layer and the second gate insulating layer is equal to or more than 50 nm.

14. The display device according to claim 11, wherein
a total thickness of the first gate insulating layer and the second gate insulating layer is equal to or less than 600 nm.

15. The display device according to claim 10, wherein
the first gate insulating layer and the third gate insulating layer are silicon nitride layers,
the second gate insulating layer and the fourth gate insulating layer are silicon oxide layers,
the second gate insulating layer is thicker than the first gate insulating layer, and
the fourth gate insulating layer is thicker than the third gate insulating layer.

16. The display device according to claim 15, wherein
the first gate insulating layer and the third gate insulating layer each have a thickness of equal to or more than 30 nm and equal to or less than 400 nm,
the second gate insulating layer and the fourth gate insulating layer each have a thickness of equal to or more than 50 nm and equal to or less than 500 nm, and
a total thickness of the first gate insulating layer and the second gate insulating layer and a total thickness of the third gate insulating layer and the fourth gate insulating layer are each equal to or more than 400 nm.

17. The display device according to claim 15, wherein
a difference in thickness between the first gate insulating layer and the second gate insulating layer is equal to or more than 50 nm, and
a difference in thickness between the third gate insulating layer and the fourth gate insulating layer is equal to or more than 50 nm.

18. The display device according to claim 15, wherein
a total thickness of the first gate insulating layer and the second gate insulating layer is equal to or less than 600 nm, and
a total thickness of the third gate insulating layer and the fourth gate insulating layer is equal to or less than 600 nm.

* * * * *